(12) United States Patent
Achter et al.

(10) Patent No.: US 6,778,437 B1
(45) Date of Patent: Aug. 17, 2004

(54) MEMORY CIRCUIT FOR PROVIDING WORD LINE REDUNDANCY IN A MEMORY SECTOR

(75) Inventors: Michael Achter, Sunnyvale, CA (US); Xin Guo, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 94 days.

(21) Appl. No.: 10/635,974

(22) Filed: Aug. 7, 2003

(51) Int. Cl.[7] .......................... G11C 16/04; G11C 16/06
(52) U.S. Cl. .......................... 365/185.05; 365/185.09; 365/185.29
(58) Field of Search .................. 365/185.05, 185.09, 365/185.11, 185.13, 185.18, 185.23, 185.29

(56) References Cited

U.S. PATENT DOCUMENTS

| | | | | |
|---|---|---|---|---|
| 5,963,479 A | * | 10/1999 | Park et al. ............. | 365/185.29 |
| 6,055,184 A | * | 4/2000 | Acharya et al. ........ | 365/185.11 |
| 6,219,280 B1 | * | 4/2001 | Naganawa ............. | 365/185.11 |
| 6,246,608 B1 | * | 6/2001 | Odani ................... | 365/185.29 |
| 6,438,028 B1 | * | 8/2002 | Kobayashi et al. .... | 365/185.05 |
| 6,456,530 B1 | * | 9/2002 | Micheloni et al. ..... | 365/185.18 |
| 6,646,950 B2 | * | 11/2003 | Akaogi .................. | 365/185.13 |

* cited by examiner

*Primary Examiner*—Trong Phan
(74) *Attorney, Agent, or Firm*—Farjami & Farjami LLP

(57) ABSTRACT

According to one embodiment, the memory circuit comprises a memory sector having a plurality of memory cells. Each of the plurality of memory cells has a gate connected to a corresponding word line, where each corresponding word line is further connected to an output of a corresponding decoding circuit. Each corresponding decoding circuit receives a corresponding vertical word line signal, a corresponding global word line signal, and a corresponding sector supply voltage. The corresponding sector supply voltage is capable of supplying an erase voltage, such as −9 V for a negative gate erase memory device, for example. With this arrangement, the corresponding decoding circuit is capable of selectively excluding the corresponding word line from receiving the erase voltage during the erase operation.

20 Claims, 6 Drawing Sheets

MEMORY CIRCUIT FOR PROVIDING WORD LINE REDUNDANCY IN A MEMORY SECTOR

TECHNICAL FIELD

The present invention relates generally to the field of semiconductor devices. More particularly, the present invention relates to semiconductor memory devices.

BACKGROUND ART

Memory devices are known in the art for storing electronic data in a wide variety of electronic devices and applications. A typical memory device comprises a plurality of memory cells. Often, memory cells are arranged in an array format, where a row of memory cells corresponds to a word line, and a column of memory cells corresponds to a bit line, and where each memory cell defines a binary bit, i.e., either a zero ("0") bit or a one ("1") bit. For example, a memory cell may be defined as either being a "programmed" cell or an "erased" cell, where, according to one particular convention, a programmed cell is representative of a "0" bit, and an erased cell is representative of a "1" bit.

Memory cells are grouped into memory sectors, where each memory sector includes a number of memory cells. For example, a memory sector can include an array of memory cells arranged into 1024 bit lines and 512 word lines. During an erase operation, all the memory cells within a target memory sector are erased. For a, negative gate erase memory device, this erase operation involves applying a large negative voltage to the gate of each memory cell within the target memory sector, and applying a large positive voltage to the well of each memory cell within the target memory sector. Conventionally, the large negative voltage supplied to the gate is provided by a single sector supply voltage by way of a pass gate. Thus, when the pass gate is enabled during the erase operation, the single sector supply voltage is supplied to each word line of the target memory sector.

Defects to the word lines within a memory sector can occur during memory fabrication. Such defects include adjacent word lines being shorted together and individual word lines being broken, for example. These defects create serious problems during a memory erase operation. As described above, a single sector supply voltage is provided to each word line of a target memory sector during an erase operation. When this voltage is supplied to a defective word line during a memory erase operation, the memory cell associated with the defective word line become overerased cells, and as a result, these overerased cells will leak excessively, ultimately causing the memory device to fail. Currently, there are no satisfactory solutions to deal with this problem. Instead, manufacturers typically acknowledge the existence of a certain level of defect density in a memory device, and disable memory sectors having defective word lines from operation. Unfortunately, this approach results in significantly reduced yield. In order to provide sufficient capacity, redundant memory sectors are required, resulting in increased silicon area and increased device size, both of which are undesirable. Accordingly, there exists a strong need in the art for a memory circuit for providing word line redundancy in a memory sector during memory erase operations, which results in reduced silicon area, reduced device size and increased yield in a memory device.

SUMMARY

The present invention is directed to a memory circuit for providing word line redundancy in a memory sector during memory erase operations. The present invention addresses and resolves the need in the art for a memory circuit which results in reduced silicon area, reduced device size and increased yield in a memory device. According to one exemplary embodiment, the memory circuit comprises a memory sector having a plurality of memory cells. Each of the plurality of memory cells has a gate connected to a corresponding word line, where each corresponding word line is further connected to an output of a corresponding decoding circuit. Each corresponding decoding circuit receives a corresponding vertical word line signal, a corresponding global word line signal, and a corresponding sector supply voltage. The corresponding sector supply voltage is capable of supplying an erase voltage, such as −9 V for a negative gate erase memory device, for example. With this arrangement, the corresponding decoding circuit is capable of selectively excluding the corresponding word line from receiving the erase voltage during the erase operation.

According to one particular embodiment, the corresponding word line is excluded from receiving the erase voltage based upon at least one of the corresponding vertical word line signal and the corresponding global word line signal. For example, the corresponding vertical word line signal can be switched between a negative voltage and zero volts, where if the vertical word line is switched to the negative voltage, the corresponding word line is excluded from receiving the erase voltage. As another example, the corresponding global word line signal can be switched between a positive voltage and a negative voltage, where if the corresponding global word line is switched to the negative voltage, the corresponding word line is excluded from receiving the erase voltage.

According to another embodiment, the memory circuit further comprises a plurality of local sector supply voltages. Each of the plurality of local sector supply voltages is supplied to the memory sector during the erase operation. In this particular embodiment, the corresponding sector supply voltage corresponds to one of the plurality of local sector supply voltages. The plurality of local sector supply voltages can be configured to supply either an erase voltage or a non-erase voltage independently of the others of the plurality of local sector supply voltages. With this arrangement, the corresponding word line is excluded from receiving the erase voltage by configuring at least one of the plurality of local sector supply voltages to supply the non-erase voltage.

Other features and advantages of the present invention will become more readily apparent to those of ordinary skill in the art after reviewing the following detailed description and accompanying drawings.

DETAILED DESCRIPTION OF THE INVENTION

The present invention is directed to a memory circuit for providing word line redundancy in a memory sector during memory erase operations. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. In the present application, a memory sector on which an erase operation is to be performed is also referred to as a "target memory sector."

Figure 1:
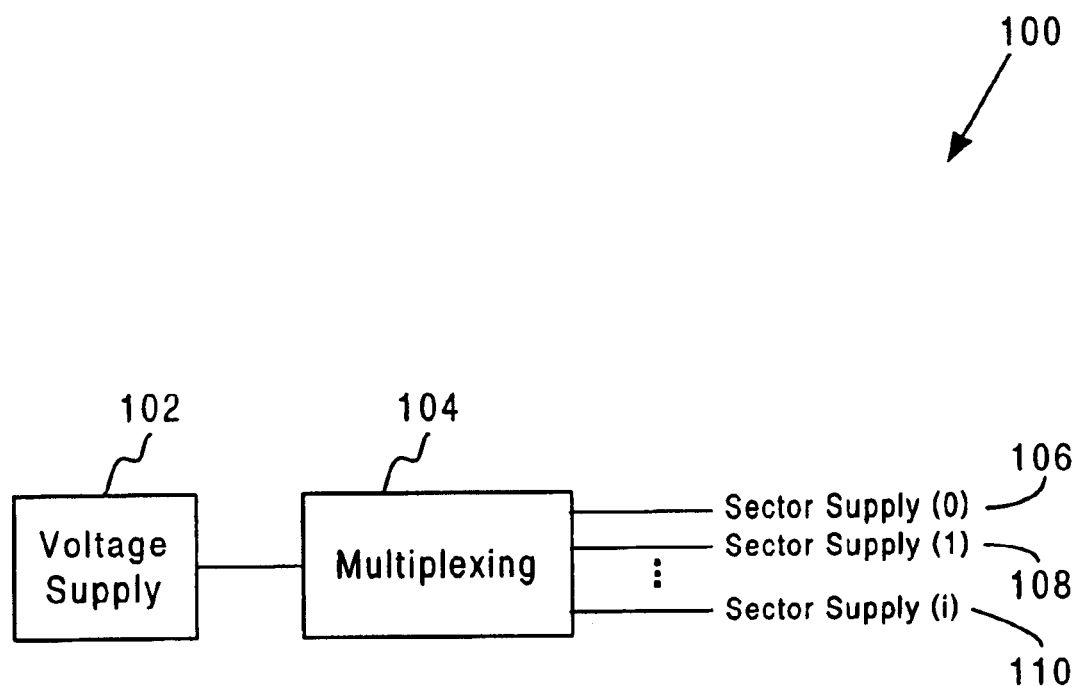
FIG. 1 depicts a known sector supply voltage arrangement.

FIG. 1 is a block diagram illustrating typical sector supply voltage arrangement 100. In sector supply voltage arrangement 100, voltage supply 102 can be a charge pump or a battery and supplies a voltage which is provided to a target memory sector during an erase operation. In the present application, the voltage supplied to a memory cell gate and having a magnitude sufficient to carry out an erase operation is also referred to as an "erase voltage." For a negative gate erase memory device, voltage supply 102 supplies −9 Volts (V), which can be supplied to the gates of the memory cells within a target memory sector. The output of voltage supply 102 is provided to multiplexing circuit 104. Multiplexing circuit 104 receives the output of voltage supply 102 and generates a number of sector supply outputs 106, 108 and 110. Each of sector supply outputs 106, 108 and 110 is supplied to a corresponding target memory sector during an erase operation. Thus, with sector supply voltage arrangement 100, a particular target memory sector is supplied a single sector supply voltage provided by one of sector supply outputs 106, 108 and 110.

Figure 2:
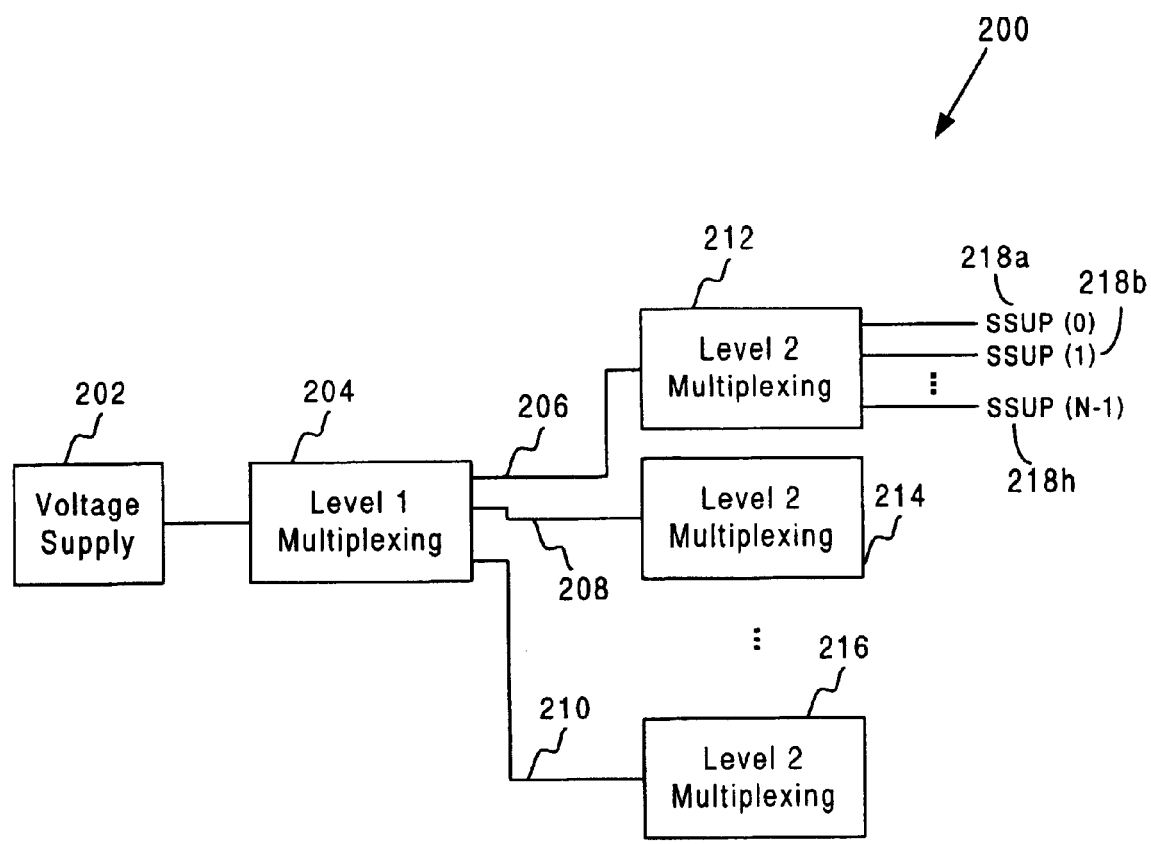
FIG. 2 depicts a sector supply voltage arrangement according to one embodiment of the present invention.

FIG. 2 is a block diagram illustrating sector supply voltage arrangement 200 in accordance with one embodiment of the present invention. Sector supply voltage arrangement 200 comprises voltage supply 202, level 1 multiplexing circuit 204, and level 2 multiplexing circuit 212, and, can be used to supply a number of local sector supply voltages to each target memory sector. As described more fully below, the invention's memory circuit can utilize local sector supply voltages for disabling defective and/or replaced word lines within a target memory sector. Voltage supply 202 corresponds to voltage supply 102 in FIG. 1, and can be a charge pump or battery for supplying an erase voltage, e.g., −9 V. The output of voltage supply 202 is provided to level 1 multiplexing circuit 204. Level 1 multiplexing circuit 204 corresponds to multiplexing circuit 104 in FIG. 1, and receives the output of voltage supply 202 and generates a number of outputs voltages 206, 208 and 210. Each of output voltages 206, 208 and 210 is associated with a respective target memory sector during an erase operation.

Each output voltage 206, 208 and 210 is further coupled to respective level 2 multiplexing circuit 212, 214 and 216, where each level 2 multiplexing circuit 212, 214 and 216 is associated with a target memory sector to be erased. Each level 2 multiplexing circuit 212, 214 and 216 generates a number of local sector supply outputs. For example, level 2 multiplexing circuit 212 receives output voltage 206 and generates local sector supply outputs SSUP(0) 218a, SSUP(1) 218b and SSUP(N−1) 218h, each of which is supplied to a designated target memory sector. Thus, during an erase operation, each target memory sector is supplied with an N number of local sector supply voltages provided by the outputs of respective level 2 multiplexing circuit 212, 214 and 216 for supplying the requisite erase voltage, e.g., −9 V, to carry out an erase operation. In accordance with the invention, level 2 multiplexing circuit 212 can also independently supply a non-erase voltage, e.g., 0 V, via each SSUP(0) 218a, SSUP(1) 218b and SSUP(N−1) 218h. For example, level 2 multiplexing circuit 212 can supply 0 V via SSUP(1) 218b, while supplying −9 V via SSUP(0) 218a and SSUP(N−1) 218h. In the exemplary embodiment, the number N of local sector supply outputs can range from 4 to 8.

Figure 3:
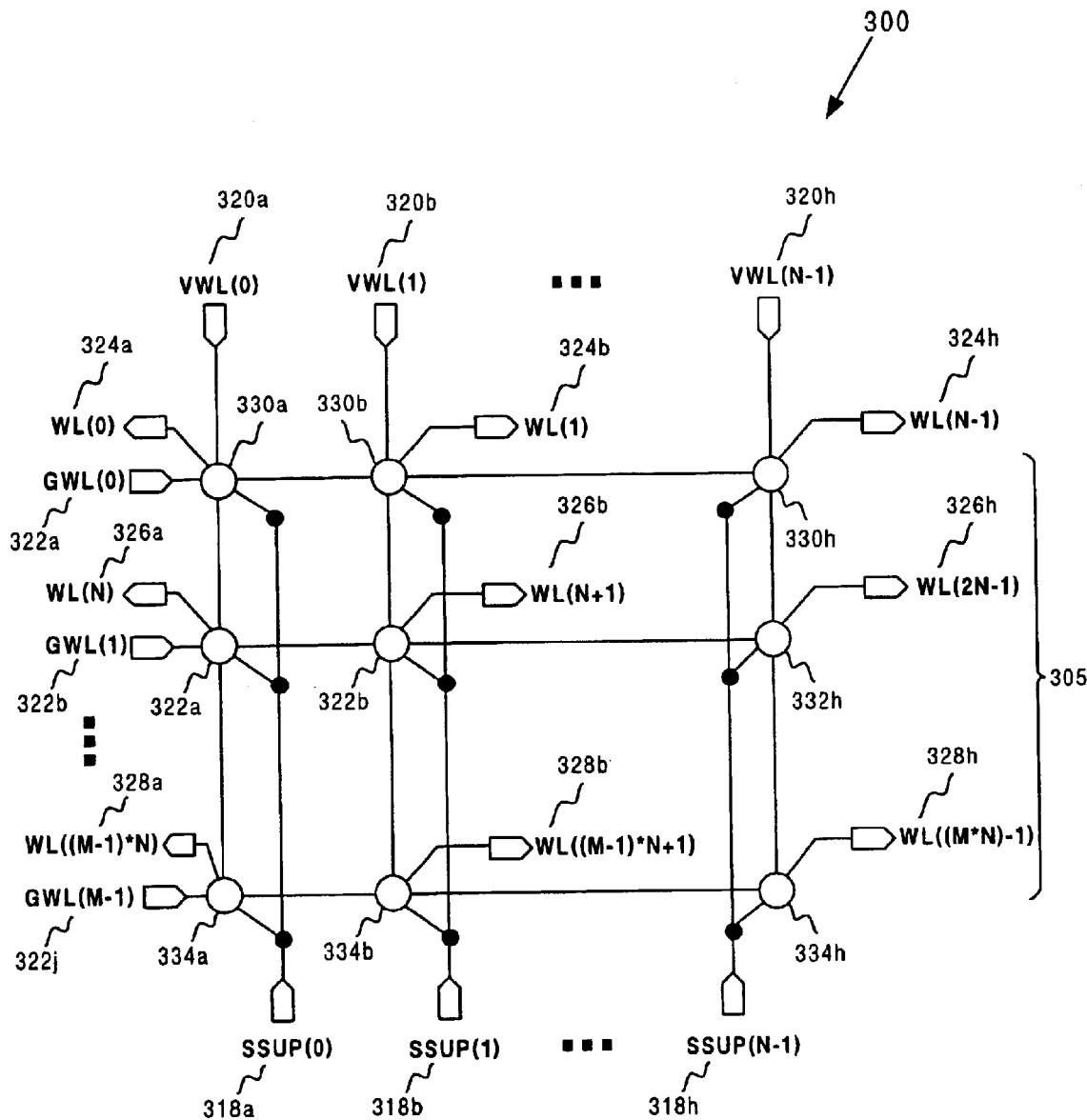
FIG. 3 depicts a memory circuit for providing word line redundancy in a memory sector according to one embodiment of the invention.

Referring now to FIG. 3, there is generally shown an architectural view of memory circuit 300 for providing word line redundancy in memory sector 305 according to one embodiment of the invention. By way of illustration, memory sector 305 can be one of a number of memory sectors in a memory device employing floating gate memory cells. For ease of illustration, memory cells of memory sector 305 are not shown in FIG. 3. As described below, memory circuit 300 prevents memory cells associated with replaced word lines from becoming overerased and becoming a source of leakage by selectively excluding the gate of replaced memory cells from receiving an erase voltage. As a result, word line redundancy can be provided within memory sector 305, resulting in increased yield, reduced silicon area and reduced device size.

Continuing with FIG. 3, memory circuit 300 comprises a plurality of decoding circuits 330a, 330b and 330h, 332a, 332b and 332h, and 334a, 334b and 334h, each having an output connected to respective word line WL(0) 324a, WL(1) 324b and WL(N−1) 324h, WL(N) 326a, WL(N+1) 326b and WL(2N−1) 326h, and WL((M−1)*N) 328a, WL((M−1)*N+1) 328b and WL ((M*N)−1) 328h. As described above, each WL(0) 324a, WL(1) 324b and WL(N−1) 324h, WL(N) 326a, WL(N+1) 326b and WL(2N−1) 326h, and WL((M−1)*N) 328a, WL((M−1)*N+1) 328b and WL ((M*N)−1) 328h is connected to a gate of a respective memory cell in memory sector 305. Each decoding circuit 330a, 330b and 330h, 332a, 332b and 332h, and 334a, 334b and 334h receives as its inputs respective vertical word line signal (VWL(0) 320a, VWL(1) 320b and VWL(N−1) 320h), respective global word line signal (GWL (0) 322a, GWL(1) 322b and GWL(M−1) 322j) and respective local sector supply voltage (SSUP(0) 318a, SSUP(1) 318b and SSUP(N−1) 318h). For example, decoding circuit 330b receives VWL(1) 320b, GWL(0) 322a and SSUP(1) 318b and generates WL(1) 324b. Each SSUP(0) 318a, SSUP(1) 318b and SSUP(N−1) 318h supplies a local sector supply voltage to memory sector 305 during an erase operation as described above in conjunction with FIG. 2.

As shown in FIG. 3, WL(0) 324a, WL(1) 324b and WL(N−1) 324h, WL(N) 326a, WL(N+1) 326b and WL(2N−1) 326h, and WL((M−1)*N) 328a, WL((M−1)*N+1) 328b and WL ((M*N)−1) 328h are arranged in an array defined by the intersection of the decoding carried out by signals VWL(0) 320a, VWL(1) 320b and VWL(N−1) 320h and GWL(0) 322a, GWL(1) 322b and GWL (M−1) 322j. Each SSUP(0) 318a, SSUP(1) 318b and SSUP(N−1) 318h is further associated with corresponding VWL(0) 320a, VWL (1) 320b and VWL(N−1) 320h. The signals carried by VWL(0) 320a, VWL(1) 320b and VWL(N−1) 320h and GWL(0) 322a, GWL(1) 322b and GWL (M−1) 322j determine which of WL(0) 324a, WL(1) 324b and WL(N−1) 324h, WL(N) 326a, WL(N+1) 326b and WL(2N−1) 326h, and WL((M−1)*N) 328a, WL((M−1)*N+1) 328b and WL ((M*N)−1) 328h are supplied respective SSUP(0) 318a, SSUP(1) 318b and SSUP(N−1) 318h. With this arrangement, memory circuit 300 is capable of achieving word line redundancy in memory sector 305 by selectively excluding one or more of WL(0) 324a, WL(1) 324b and WL(N−1) 324h, WL(N) 326a, WL(N+1) 326b and WL(2N−1) 326h, and WL((M−1)*N) 328a, WL((M−1)*N+1) 328b and WL ((M*N)−1) 328h from receiving an erase voltage by way of SSUP(0) 318a, SSUP(1) 318b and SSUP(N−1) 318h.

By way of illustration, if there is a defect in WL(1) 324b, for example, such as a break, memory circuit 300 is able to selectively exclude WL(1) 324b from receiving an erase voltage via SSUP(1) 318b in order to prevent memory cells associated with WL(1) 324b from becoming overerased and leaking during other operations. As described above, SSUP (1) 318b is able to supply a voltage independent from that supplied by SUPP(0) 318a, and SSUP(N−1) 318h. Thus, SSUP(1) 318b can supply 0 V while, each of SUPP(0) 318a and SSUP(N−1) 318h supplies −9 V. As such, WL(1) 324b is supplied 0 V, while each of WL(0) 324a and WL(N−1) 324h is supplied −9 V. Similarly each of the word lines associated with VWL(1) 320b, e.g., WL(1) 324b, WL(N+1) 326b and WL ((M−1)*N+1) 328b, is supplied 0 V, while each of the word lines associated with VWL(0) 320a and VWL(N−1) 320h is supplied −9 V. As illustrated in this example, only those word lines associated with VWL(1) 320b are replaced and excluded from receiving an erase voltage, while word lines that are not excluded still receive the requisite erase voltage for carrying out an erase operation. In the case where memory sector 305 has 512 word lines, and the number of local sector supplies provided to memory sector 305 is 8, i.e., N=8, the number of word lines replaced is 64. Compared to the conventional approach which involves replacing the entire sector, i.e., 512 word lines, memory circuit 300 is able to achieve word line redundancy and replace only 64 word lines within sector 305.

Figure 4:
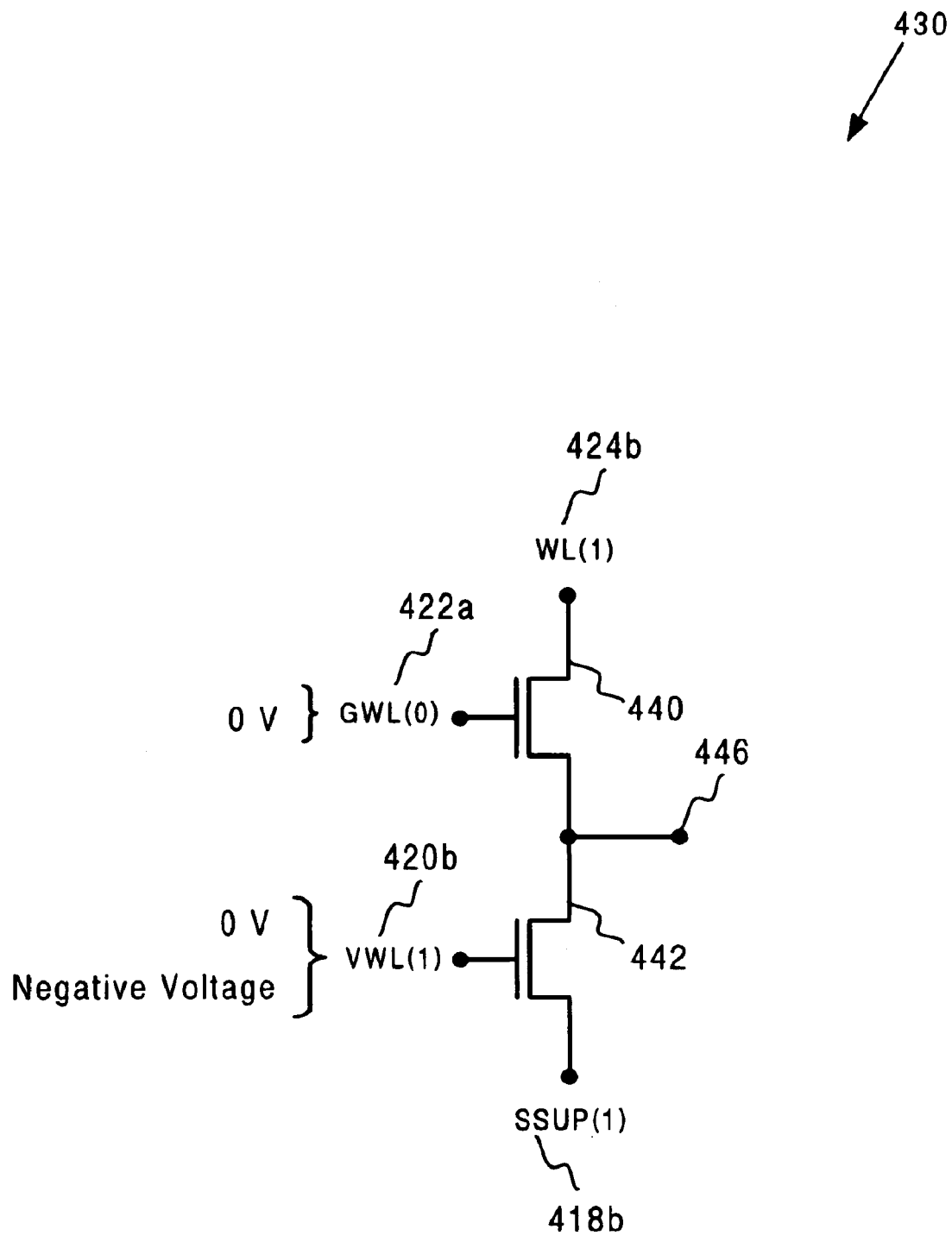
FIG. 4 depicts a schematic of an exemplary decoding circuit according to one embodiment of the invention.

According to another feature of the invention, each of decoding circuit 330a, 330b and 330h, 332a, 332h and 332h, and 334a, 334b and 334h is also able to selectively exclude a word line from receiving an erase voltage. To illustrate this feature with respect to WL(1) 324b, reference is made to FIG. 4 which illustrates a simplified schematic of an exemplary embodiment of decoding circuit 430. In FIG. 4, decoding circuit 430, WL(1) 424b, GWL(0) 422a, VWL(1) 420b and SSUP(1) 418b correspond respectively to decoding circuit 330b, WL(I) 324b, GWL(0) 322a, VWL(1) 320b and SSUP(1) 318b in FIG. 3. Decoding circuit 430 comprises transistors 440 and 442. The drain of transistor 440 is coupled to WL(1) 424b, and the gate of transistor 440 is coupled to GWL(0) 422a. The source of transistor 440 is coupled to the drain of transistor 442 at intermediate node 446. The gate of transistor 442 is coupled to VWL(1) 420b, and the source of transistor 442 is coupled to SSUP(1) 418.

As shown in FIG. 4, GWL(0) 422a is generally at 0 V, while VWL(1) 420b can be switched between 0 V and a negative voltage. If VWL(1) 420b is at 0 V, and SSUP(1) 418b is at −9 V, transistor 442 is activated pulling down intermediate node 446 to approximately −9 V. Likewise, when GWL(0) 422a is at 0 V, and intermediate node is approximately −9 V, transistor 440 is activated, and WL(1) 424b is supplied approximately −9 V. If SSUP(1) 418b provides −9 V, and VW(1) 424b is defective, VWL(1) 420b can be switched to the same negative voltage as SSUP(1) 418b, e.g., 9 V, to prevent transistor 442 from being activated, thereby preventing WL(1) 424b from receiving the negative voltage supplied by SSUP(1) 418b. Thus, the memory cell associated with WL(1) 424b is prevented from becoming overerased and leaking during other operations.

Referring again to FIG. 3, decoding circuit 330b can thus function to selectively exclude WL(1) 324b from receiving an erase voltage. Since VWL(1) 320b drives each of respective decoding circuit 330b, 332b, and 334b, each of respective WL(1) 324b, WL(N+1) 326b and WL((M−1)*N+1) 328b is also excluded from receiving an erase voltage. As illustrated in this example, only those word lines associated with VWL(1) 320b are replaced and excluded from receiving an erase voltage, while word lines that are not excluded still receive the requisite erase voltage for carrying out an erase operation.

Due to the operation of memory circuit 300, memory circuit 300 prevents a replaced word line from receiving an erase voltage during an erase operation. Although the well of the memory cell associated with the replaced word line still receives a well voltage, e.g., approximately 9 V, the gate of the memory cell is prevented from receiving the requisite erase voltage, e.g., −9 V. As a result, the memory cell associated with the replaced word line is prevented from becoming overerased and leaking during other operations. Word line redundancy can thus be provided within sector 305, since due to the operation of memory circuit 300, memory cells associated with replaced word lines are prevented from becoming overerased and leaking during other operations, ultimately reducing the likelihood of device failure. In the case where memory sector 305 has 512 word lines, and the number of VWL(0) 320a, VWL(1) 320b and VWL(N−1) 320h is 8, i.e., N=8, the number of word lines replaced is 64. Compared to the conventional approach which involves replacing the entire sector, i.e., 512 word lines, memory circuit 300 is able to achieve word line redundancy and replace only 64 word lines within sector 305. Memory circuit 300 is thus able to achieve much greater yield. Moreover since only a small number of word lines, e.g., 64 word lines in the present exemplary embodiment, within a memory sector are replaced, silicon area and device size is also reduced.

Figure 5:
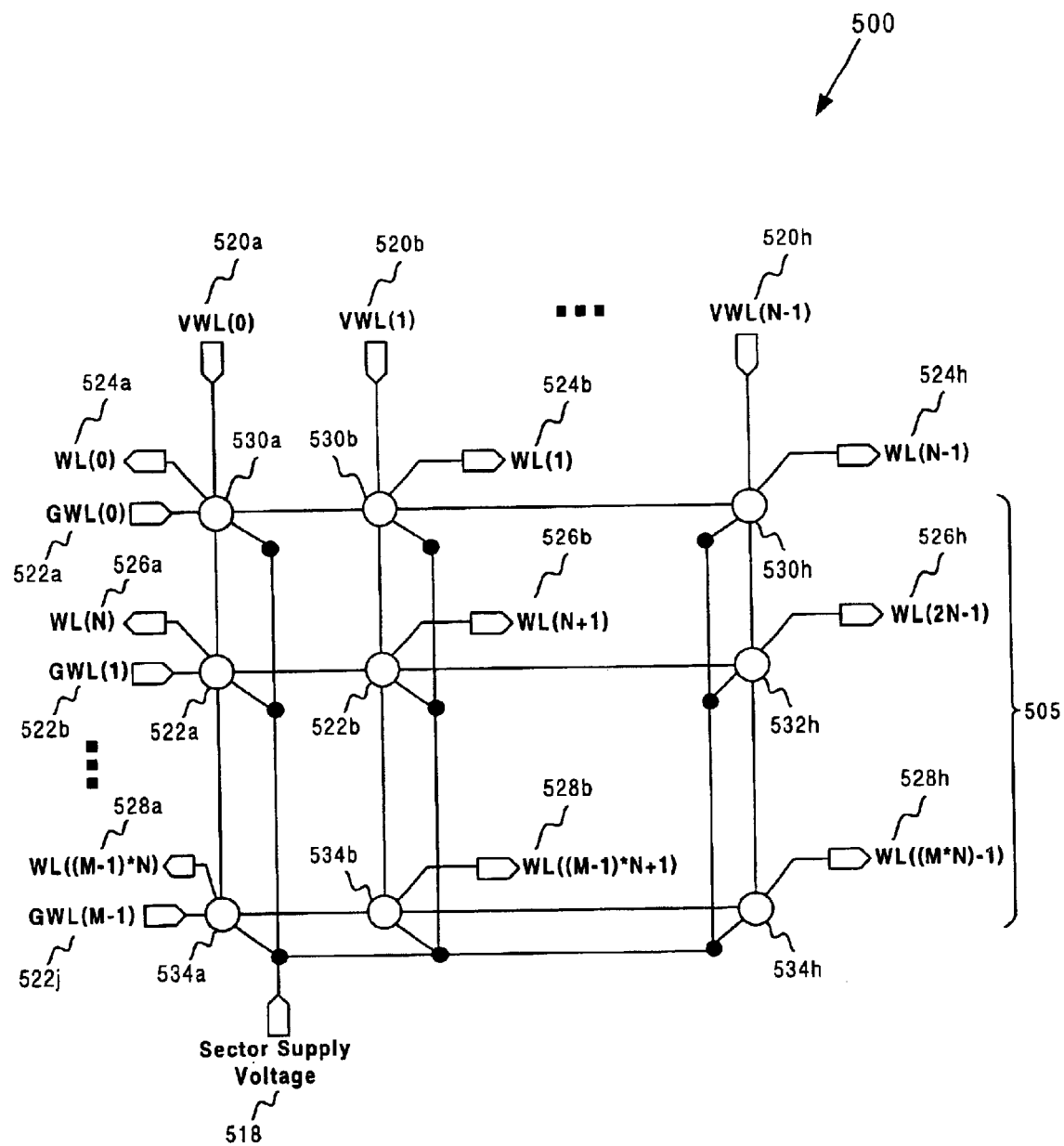
FIG. 5 depicts a memory circuit for providing word line redundancy in a memory sector according to another embodiment of the invention.

Referring next to FIG. 5, there is generally shown an architectural view of memory circuit 500 for providing word line redundancy in memory sector 505 according to one embodiment of the invention. Memory sector 505 can be one of a number of memory sectors in a memory device employing floating gate memory cells. For ease of illustration, memory cells of memory sector 505 are not shown in FIG. 5. As discussed below, memory circuit 500 prevents memory cells associated with replaced word lines from becoming overerased cells and becoming a source of leakage by selectively excluding the gate of the replaced memory cells from receiving an erase, voltage. As a result, word line redundancy can be provided within memory sector 505, resulting in increased yield, reduced silicon area and reduced device size.

In FIG. 5, memory circuit 500 comprises a plurality of decoding circuits 530a, 530b and 530h, 532a, 532b and 532h, and 534a, 534b and 534h, each having an output connected to respective word line WL(0) 524a, WL(1) 524b and WL(N−1) 524h, WL(N) 526a, WL(N+1) 526b and WL(2N−1) 526h, and WL((M−1)*N) 528a, WL((M−1)*N+1) 528b and WL ((M*N)−1) 528h. Each WL(0) 524a, WL(1) 524b and WL(N−1) 524h, WL(N) 526a, WL(N+1) 526b and WL(2N−1) 526h, and WL((M−1)*N) 528a, WL((M−1)*N+1) 528b and WL ((M*N)−1) 528h is connected to a gate of a respective memory cell in memory sector 505. Each decoding circuit 530a, 530b and 530h, 532a, 532b and 532h, and 534a, 534b and 534h receives as its inputs respective VWL(0) 520a, VWL(1) 520b and VWL(N−1) 520h, respective GWL(0) 522a, GWL(0) 522b and GWL(M−1) 522j and sector supply voltage 518. Unlike FIG. 3, memory circuit 500 receives single sector supply voltage 518, e.g., as described above in conjunction with FIG. 1, rather than a number of local sector supply voltages. For example, decoding circuit 530b receives VWL(1) 520b, GWL(0) 522a and sector supply voltage 518 and generates WL(1) 524b. Sector supply voltage 518 supplies an erase voltage to memory sector 505 during an erase operation.

As shown in FIG. 5, WL(0) 524a, WL(1) 524b and WL(N−1) 524h, WL(N) 526a, WL(N+1) 526b and WL(2N−1) 526h, and WL((M−1)*N) 528a, WL((M−1)*N+1) 528b and WL((M*N)−1) 528h are arranged in an array defined by the intersection of the decoding carried out by signals VWL(0) 520a, VWL(1) 520b and VWL(N−1) 520h and GWL(0) 522a, GWL(0) 522b and GWL(M−1) 522j. The signals carried by VWL(0) 520a, VWL(1) 520b and VWL(N−1) 520h and GWL(0) 522a, GWL(0) 522b and GWL(M−1) 522j determine which of WL(0) 524a, WL(1) 524b and WL(N−1) 524h, WL(N) 526a, WL(N+1) 526b and WL(2N−1) 526h, and WL((M−1)*N) 528a, WL((M−1)*N+1) 528b and WL((M*N)−1) 528h are supplied sector supply voltage 518. With this arrangement, memory circuit 500 is capable of achieving word line redundancy in memory sector 505 by selectively excluding one or more of WL(0) 524a, WL(1) 524b and WL(N−1) 524h, WL(N) 526a, WL(N+1) 526b and WL(2N−1) 526h, and WL((M−1)*N) 528a, WL((M−1)*N+1) 528b and WL ((M*N)−1) 528h from receiving an erase voltage by way of sector supply voltage 518.

Figure 6:
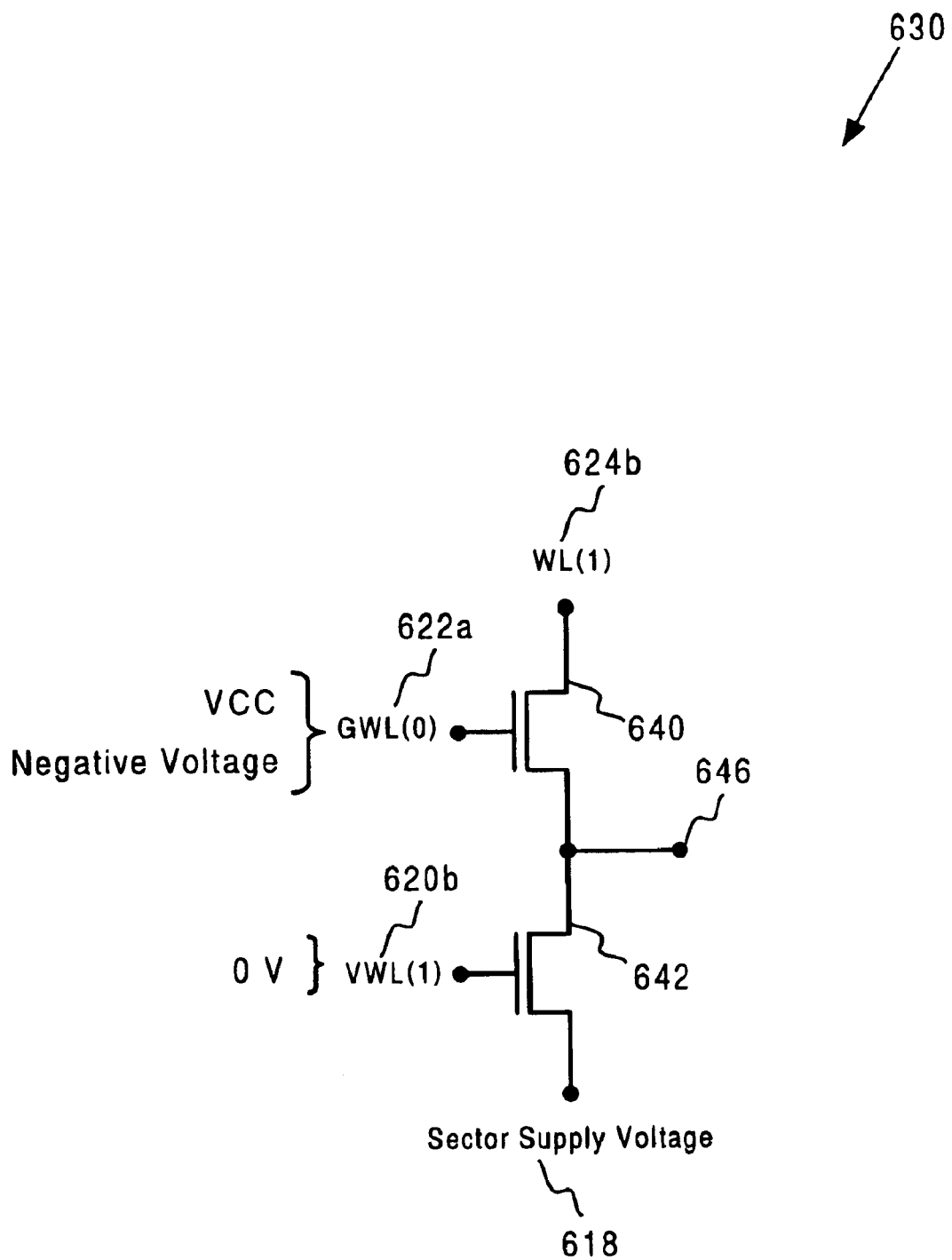
FIG. 6 depicts a schematic of an exemplary decoding circuit according to another embodiment of the invention.

To illustrate this feature with respect to WL(1) 524b, reference is made to FIG. 6 which illustrates a simplified schematic of an exemplary embodiment of decoding circuit 630. In FIG. 6, decoding circuit 630, WL(1) 624b, GWL(0) 622a, VWL(1) 620b and sector supply voltage 618 correspond respectively to decoding circuit 530b, WL(1) 524b, GWL(0) 522a, VWL(1) 520b and sector supply voltage 518 in FIG. 5. Decoding circuit 630 comprises transistors 640 and 642. The drain of transistor 640 is coupled to WL(1) 624b, and the gate of transistor 640 is coupled to GWL(0) 622a. The source of transistor 640 is coupled to the drain of transistor 642 at intermediate node 646. The gate of transistor 642 is coupled to VWL(1) 620b, and the source of transistor 642 is coupled to sector supply voltage 618.

As shown in FIG. 6, VWL(1) 620b is generally at 0 V, while GWL(0) 622b can be switched between positive supply voltage (VCC) and a negative voltage. If VWL(1) 620b is at 0 V, and sector supply voltage 618 is at −9 V, transistor 642 is activated pulling down intermediate node 646 to approximately −9 V. Likewise, when GWL(0) 622a is at VCC, and intermediate node is approximately −9 V, transistor 640 is activated, and WL(1) 624b is supplied approximately −9 V. If sector supply voltage 618 provides −9 V, and VW(1) 624b is defective, GWL(0) 622a can be switched to approximate the same negative voltage as intermediate node 646, e.g., −9 V, to prevent transistor 640 from being activated, thereby preventing WL(1) 624b from receiving the negative voltage supplied by sector supply voltage 618. Thus, the memory cell associated with WL(1) 624b is prevented from becoming overerased and leaking during other operations.

Referring again to FIG. 5, decoding circuit 530b can thus function to selectively exclude WL(1) 524b from receiving an erase voltage. Since GWL(0) 522a drives each of respective decoding circuit 530a, 530b and 530h, each of respective WL(0) 524a, WL(1) 524b and WL(N−1) 524h is also excluded from receiving an erase voltage. As illustrated in this example, only those word lines associated with GWL(0) 522a are replaced and excluded from receiving an erase voltage, while word lines that are not excluded still receive the requisite erase voltage for carrying out an erase operation.

Due to the operation of memory circuit 500, memory circuit 500 prevents a replaced word line from receiving an erase voltage during an erase operation. Although the well of the memory cell associated with the replaced word line still receives a well voltage, e.g., approximately 9 V, the gate of the memory cell is prevented from receiving the requisite erase voltage, e.g., −9 V. As a result, the memory cell associated with the replaced word line is prevented from becoming overerased and leaking during other operations. Word line redundancy can thus be provided within sector 505, since due to the operation of memory circuit 500, memory cells associated with replaced word lines are prevented from becoming overerased and leaking during other operations. In the case where memory sector 505 has 512 word lines, and the number of GWL(0) 522a, GWL(0) 522b and GWL(M−1) 522j is 64, i.e., M=64, the number of word lines replaced is 8. Compared to the conventional approach which involves replacing the entire sector, i.e., 512 word lines, memory circuit 500 is able to achieve word line redundancy and replace only 8 word lines within sector 505. Memory circuit 500 is thus able to achieve much greater yield, and since only a small number of word lines, e.g., 8 word lines in the present exemplary embodiment, within a memory sector are replaced, silicon area and device size is reduced.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. For example, features of the embodiments described in FIGS. 3 and 4 and FIGS. 5 and 6 could be combined to achieve even finer granularity of word line redundancy, e.g., providing replacement of individual word lines. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a memory circuit that provides word line redundancy in a memory sector has been described.

What is claimed is:

1. A memory circuit for providing word line redundancy in a memory sector during an erase operation, said memory circuit comprising:

said memory sector comprising a plurality of memory cells;

each said plurality of memory cells having a gate connected to a corresponding word line;

each said corresponding word line connected to an output of a corresponding decoding circuit;

each said corresponding decoding circuit receiving a corresponding vertical word line signal, a corresponding global word line signal, and a corresponding sector supply voltage;

said corresponding sector supply voltage being capable of supplying an erase voltage;

each said corresponding decoding circuit further being capable of selectively excluding said corresponding word line from receiving said erase voltage during said erase operation.

2. The memory circuit of claim 1, wherein said corresponding word line is excluded from receiving said erase voltage based upon at least one of said corresponding vertical word line signal and said corresponding global word line signal.

3. The memory circuit of claim 2, wherein said corresponding vertical word line signal can be switched between a negative voltage and zero volts.

4. The memory circuit of claim 2, wherein said corresponding global word line signal can be switched between a positive voltage and a negative voltage.

5. The memory circuit of claim 1, wherein said erase voltage is approximately −9 Volts.

6. The memory circuit of claim 1, further comprising a plurality of local sector supply voltages supplied to said memory sector during said erase operation, said corresponding sector supply voltage corresponding to a first one of said plurality of local sector supply voltages.

7. The memory circuit of claim 6, wherein each of said plurality of local sector supply voltages can be configured to supply either an erase voltage or a non-erase voltage independently of the others of said plurality of local sector supply voltages, wherein said corresponding word line is capable of being excluded from receiving said erase voltage by configuring at least one of said plurality of local sector supply voltages to supply said non-erase voltage.

8. The memory circuit of claim 7, wherein a second word line is supplied said erase voltage by a second one of said plurality of local sector supply voltages during said erase operation.

9. The memory circuit of claim 7, wherein said non-erase voltage is approximately zero Volts.

10. A memory circuit for providing word line redundancy in a memory sector during an erase operation, said memory sector comprising a plurality of memory cells, each said plurality of memory cells having a gate connected to a corresponding word line, said memory circuit comprising:

voltage supply means for supplying a sector supply voltage, said sector supply voltage being capable of supplying an erase voltage;

decoding means for receiving a vertical word line signal, a global word line signal, and said sector supply voltage;

said decoding means coupled to said corresponding word line;

said decoding means further comprising means for selectively excluding said corresponding word line from receiving said erase voltage during said erase operation.

11. The memory circuit of claim 10, wherein said corresponding word line is excluded from receiving said erase voltage based upon at least one of said vertical word line signal and said global word line signal.

12. The memory circuit of claim 11, wherein said vertical word line signal can be switched between a negative voltage and zero volts.

13. The memory circuit of claim 11, wherein said global word line signal can be switched between a positive voltage and a negative voltage.

14. The memory circuit of claim 10, wherein said erase voltage is approximately −9 Volts.

15. The memory circuit of claim 10, further comprising means for providing a plurality of local sector supply voltages, said plurality of local sector supply voltages supplied to said memory sector during said erase operation, said sector supply voltage corresponding to one of said plurality of local sector supply voltages.

16. The memory circuit of claim 15, wherein each of said plurality of local sector supply voltages can be configured to supply either an erase voltage or a non-erase voltage independently of the others of said plurality of local sector supply voltages, wherein said means for selectively excluding said corresponding word line from receiving said erase voltage comprises configuring at least one of said plurality of local sector supply voltages to supply said non-erase voltage.

17. A memory circuit for providing word line redundancy in a memory sector during an erase operation, said memory sector comprising a plurality of memory cells; each of said plurality of memory cells having a gate connected to a corresponding word line, each said corresponding word line connected to an output of a corresponding decoding circuit, said memory circuit being characterized by:

each said corresponding decoding circuit receiving a corresponding vertical word line signal, a corresponding global word line signal, and a corresponding sector supply voltage;

said corresponding sector supply voltage being capable of supplying an erase voltage;

each said corresponding decoding circuit further being capable of selectively excluding said corresponding word line from receiving said erase voltage during said erase operation.

18. The memory circuit of claim 17, wherein said corresponding word line is excluded from receiving said erase voltage based upon at least one of said corresponding vertical word line signal and said corresponding global word line signal.

19. The memory circuit of claim 17, further comprising a plurality of local sector supply voltages supplied to said memory sector during said erase operation, said corresponding sector supply voltage corresponding to one of said plurality of local sector supply voltages.

20. The memory circuit of claim 19, wherein each of said plurality of local sector supply voltages can be configured to supply either an erase voltage or a non-erase voltage independently of the others of said plurality of local sector supply voltages, wherein said corresponding word line is excluded from receiving said erase voltage by configuring at least one of said plurality of local sector supply voltages to supply said non-erase voltage.

* * * * *